(12) United States Patent
Bar-Or et al.

(10) Patent No.: US 10,108,546 B2
(45) Date of Patent: Oct. 23, 2018

(54) METHOD AND SYSTEM FOR USING NON-VOLATILE MEMORY AS A REPLACEMENT FOR VOLATILE MEMORY

(71) Applicant: SanDisk Technologies LLC, Addison, TX (US)

(72) Inventors: Shahar Bar-Or, Raanana (IL); Vsevolod Mountaniol, Givataim (IL)

(73) Assignee: SanDisk Technologies LLC, Plano, TX (US)

(*) Notice: Subject to any disclaimer, the term of this patent is extended or adjusted under 35 U.S.C. 154(b) by 287 days.

(21) Appl. No.: 14/586,205

(22) Filed: Dec. 30, 2014

(65) Prior Publication Data

US 2016/0188464 A1 Jun. 30, 2016

(51) Int. Cl.
| | | |
|---|---|---|
| *G06F 12/00* | (2006.01) | |
| *G06F 12/06* | (2006.01) | |
| *G06F 12/02* | (2006.01) | |
| *G11C 11/00* | (2006.01) | |
| *G11C 16/34* | (2006.01) | |
| *G11C 11/56* | (2006.01) | |
| *G11C 11/406* | (2006.01) | |

(52) U.S. Cl.
CPC ...... *G06F 12/0638* (2013.01); *G06F 12/0246* (2013.01); *G11C 11/005* (2013.01); *G11C 11/5628* (2013.01); *G11C 16/349* (2013.01); *G06F 2212/1036* (2013.01); *G06F 2212/205* (2013.01); *G06F 2212/7201* (2013.01); *G06F 2212/7208* (2013.01); *G06F 2212/7211* (2013.01); *G11C 11/406* (2013.01); *G11C 11/5621* (2013.01)

(58) Field of Classification Search
CPC ............ G06F 12/0638; G06F 12/0246; G06F 11/406; G06F 11/5621; G06F 14/0018; G06F 2212/205; G06F 2212/7201; G11F 11/406; G11C 11/406; G11C 11/5621; G11C 14/0018
See application file for complete search history.

(56) References Cited

U.S. PATENT DOCUMENTS

| | | | | |
|---|---|---|---|---|
| 8,499,025 | B2* | 7/2013 | Howard | G06F 8/45 709/201 |
| 2009/0144501 | A2* | 6/2009 | Yim | G06F 12/0246 711/120 |
| 2012/0246392 | A1* | 9/2012 | Cheon | G06F 12/0871 711/103 |
| 2012/0311408 | A1* | 12/2012 | Nakanishi | G06F 13/4252 714/773 |

(Continued)

*Primary Examiner* — Nanci N Wong
(74) *Attorney, Agent, or Firm* — Brinks Gilson & Lione

(57) ABSTRACT

A method and system for using non-volatile memory as a replacement for volatile memory are provided. In one embodiment, a host is in communication with a memory system having volatile memory, a first non-volatile memory, and a second non-volatile memory, wherein the first non-volatile memory has a faster performance and a higher endurance than the second non-volatile memory. The host analyzes data to be stored in the volatile memory to determine if it should instead be stored in the first non-volatile memory. If the data should be stored in the volatile memory, the host stores the data in the volatile memory. If the data should be stored in the first non-volatile memory, the host stores the data in the first non-volatile memory.

20 Claims, 5 Drawing Sheets

(56) References Cited

U.S. PATENT DOCUMENTS

| | | | |
|---|---|---|---|
| 2013/0297857 A1* | 11/2013 | Sela | G06F 9/5027 |
| | | | 711/103 |
| 2014/0244899 A1* | 8/2014 | Schmier | G06F 3/0616 |
| | | | 711/103 |
| 2015/0248244 A1* | 9/2015 | Seo | G06F 3/0611 |
| | | | 711/103 |
| 2016/0054933 A1* | 2/2016 | Haghighi | G06F 3/0611 |
| | | | 711/103 |

* cited by examiner

METHOD AND SYSTEM FOR USING NON-VOLATILE MEMORY AS A REPLACEMENT FOR VOLATILE MEMORY

BACKGROUND

Many memory systems, such as solid state drives, include both non non-volatile memory (e.g., Flash) and volatile memory (e.g., DRAM). Non-volatile memory is typically less expensive than volatile memory but has a lower performance. Accordingly, there are trade-offs when designing a memory system between performance and cost. For example, using more non-volatile memory can reduce the system's cost but may negatively impact the system's performance. So, memory systems typically have much more non-volatile memory than volatile memory and use various memory management techniques to help ensure the optimal use of the limited resource of the volatile memory (e.g., caching certain data from the non-volatile memory into the volatile memory). Additionally, a host can know that certain data should be stored in volatile memory and can store that data in volatile memory instead of non-volatile memory.

Other memory systems face similar memory trade-off problems. For example, a hybrid disc system can contain flash memory and a magnetic disc, with the flash memory being the limited resource. The controller of the memory system can use overall system statistics to decide whether to store data in the flash memory or in the magnetic disc.

Overview

Embodiments of the present invention are defined by the claims, and nothing in this section should be taken as a limitation on those claims.

By way of introduction, the below embodiments relate to a method and system for using non-volatile memory as a replacement for volatile memory. In one embodiment, a host is in communication with a memory system having volatile memory, a first non-volatile memory, and a second non-volatile memory, wherein the first non-volatile memory has a faster performance and a higher endurance than the second non-volatile memory. The host analyzes data to be stored in the volatile memory to determine if it should be stored in the volatile memory or in the first non-volatile memory. In response to determining that the data should be stored in the volatile memory, the host stores the data in the volatile memory. In response to determining that the data should be stored in the first non-volatile memory, the host stores the data in the first non-volatile memory.

In another embodiment, a host is provided having a controller and an interface configured to communicate with a memory system having volatile memory, a first non-volatile memory, and a second non-volatile memory, wherein the first non-volatile memory has a faster performance and a higher endurance than the second non-volatile memory. The controller is configured to determine if data to be stored in the volatile memory is suitable for storage instead in the first non-volatile memory. In response to determining that the data is suitable for storage instead in the first non-volatile memory, the controller routes the data to the first non-volatile memory instead of the volatile memory.

In yet another embodiment, a host is provided comprising a differentiator module and an interface configured to communicate with a memory system having random access memory (RAM), non-volatile single-level cell (SLC) memory, and non-volatile multi-level cell (MLC) memory. The differentiator module is configured to differentiate between data that needs to be stored in the RAM (versus data that can be instead stored in the non-volatile SLC memory), store the data differentiated for the RAM in the RAM, and store the data differentiated for the non-volatile SLC memory in the non-volatile SLC memory.

Other embodiments are possible, and each of the embodiments can be used alone or together in combination. Accordingly, various embodiments will now be described with reference to the attached drawings.

DETAILED DESCRIPTION OF EXEMPLARY EMBODIMENTS

As mentioned above, there are trade-offs when designing how much non-volatile memory (e.g., Flash) and volatile memory (e.g., DRAM) to provision in a memory system, as using more non-volatile memory can reduce the system's cost but may negatively impact the system's performance. The following embodiments provide a method and system for using non-volatile memory as a replacement for volatile memory. In particular, these embodiments may lower the cost of memory products by replacing some of the expensive RAM cache with relatively-fast and relatively high endurance non-volatile memory (e.g. an SLC flash) without hurting performance. These embodiments add a new non-volatile memory layer between the conventional volatile and non-volatile memories. Before turning to these and other embodiments, the following paragraphs provide a discussion of exemplary host and memory system designs that can be used with these embodiments. Of course, these are just examples, and other suitable designs can be used.

Figure 1A:
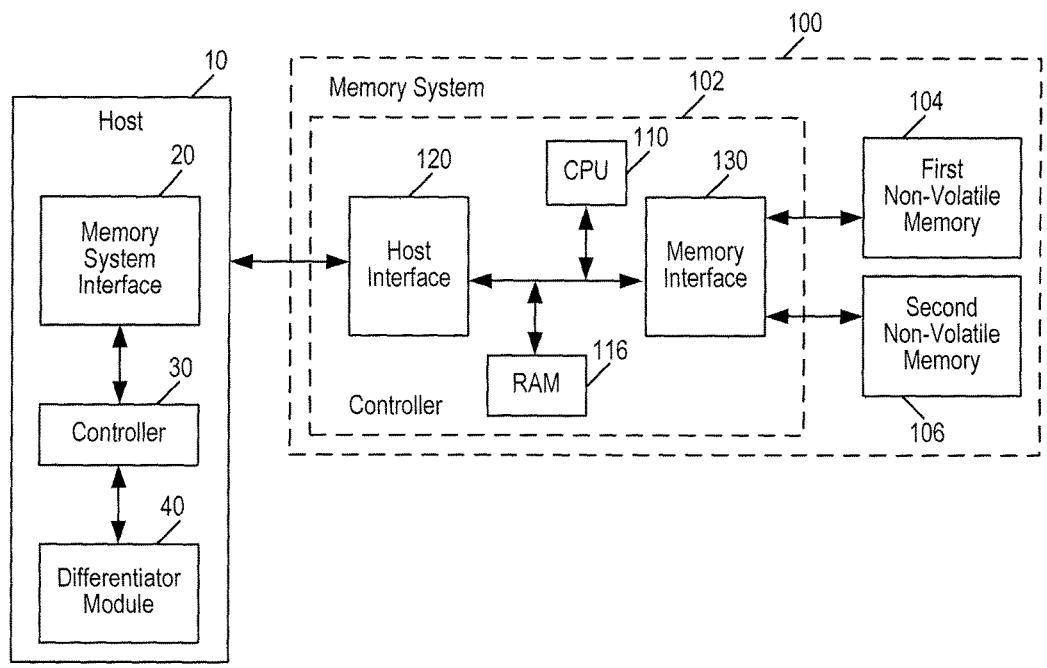
FIG. 1A is a block diagram of a host and memory system of an embodiment.

Turning now to the drawings, FIG. 1A is a block diagram of a host 10 and memory system 100 of an embodiment. The host 10 can take any suitable form, including, but not limited to, a mobile phone, a tablet computer, a digital media player, a game device, a personal digital assistant (PDA), a mobile (e.g., notebook, laptop) personal computer (PC), or a book reader. The host 10 includes a memory system interface 20 for interfacing with the memory system 100, a controller 30, and a differentiating module 40, which will be discussed in more detail below. As used herein, a "module" may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Non-volatile memory system 100 includes a controller 102 and first and second non-volatile memories 104, 106. In one embodiment, the first non-volatile memory 104 has a faster performance and a higher endurance than the second non-volatile memory 106. For example, the first non-volatile memory 104 can be a single-level cell (SLC) memory, while the second non-volatile memory 106 can be a multi-level cell (MLC) memory. The first and second non-volatile memories 104, 106 can include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The first and second non-volatile memories 104, 106 can be separate memory dies or can be partitions on a single memory die. Also, one or both of the first and second non-volatile memories 104, 106 can be made up of one or more non-volatile memory dies. As used herein, the term die refers to the collection of non-volatile memory cells, and associated circuitry for managing the physical operation of those non-volatile memory cells, that are formed on a single semiconductor substrate.

The controller 102 interfaces with the host 10 and transmits command sequences for read, program, and erase operations to the first and second non-volatile memories 104, 106. The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with the host 10. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

In this embodiment, the controller 102 contains a CPU 110, volatile memory (e.g., RAM or DRAM) 116, a host interface 120, and a memory interface 160. (The RAM 116 may be located outside of the controller 102.) The host interface 120 and memory interface 130 provide the electrical interfaces with the host 10 and memories 104, 106, respectively. The host interface 120 typically facilitates transfer for data, control signals, and timing signals, and the memory interface (e.g., a Flash interface module) 130 typically provides the command sequences to the memories 104, 106 and receives status information from the memories 104, 106. The choice of the type of host interface 120 can depend on the type of memory being used. Examples of host interfaces 120 include, but are not limited to, SATA, SATA Express, SAS, Fibre Channel, USB, PCIe, and NVMe. Similarly, the choice of the type of memory interface 130 can depend on the type of host being used. For example, the memory interface 130 may be a double data rate (DDR) interface, such as a Toggle Mode 200, 400, or 800 interface, for example.

Figure 1B:
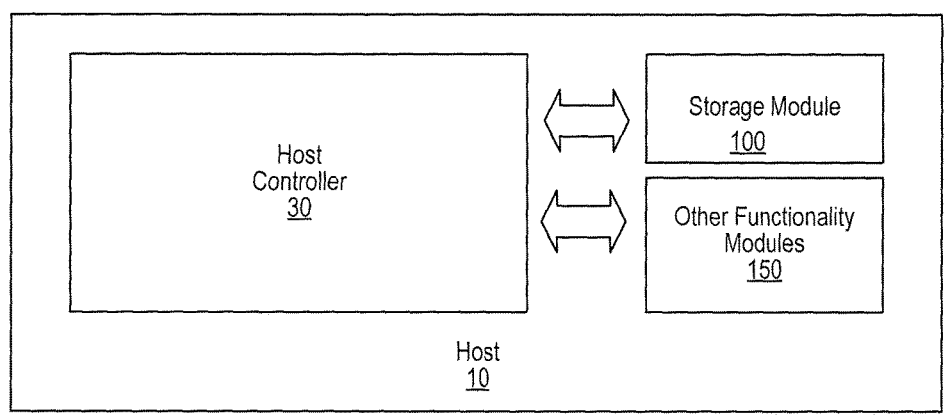
FIG. 1B is a block diagram of a host and memory system of an embodiment, where the memory system is embedded in the host.

In one embodiment, memory system 100 may be a card based system, such as a secure digital (SD), micro secure digital (micro-SD), or Compact Flash (CF) card, or a USB device, for example. In an alternate embodiment (see FIG. 1B), the memory system 100 may be integrated with the host 10 (having a host controller 30), such as when the memory system 100 is embedded in the host 10. For example, the storage module 100 can take the form of an iNAND™ eSD/eMMC embedded flash drive by SanDisk Corporation, or, more generally, any type of solid state drive (SSD), a hybrid storage device (having both a hard disk drive and a solid state drive), and a memory caching system. Also, although shown by itself in FIGS. 1A and 1B, the memory system 100 can be part of a storage module that includes plural non-volatile memory systems 100. The interface between a storage controller of the storage module and non-volatile memory systems 100 may be a bus interface, such as a serial advanced technology attachment (SATA) or peripheral component interface express (PCIe) interface. For example, a storage module may be a solid state drive (SSD), such as found in portable computing devices, such as laptop computers, and tablet computers. As another alternative, a hierarchical storage system can be used, where there are a plurality of storage controllers, each of which controls a respective storage system. Host systems may access memories within the storage system via a bus interface. In one embodiment, the bus interface may be an NVMe or fiber channel over Ethernet (FCoE) interface. In one embodiment, such a system may be a rack mountable mass storage system that is accessible by multiple host computers, such as would be found in a data center or other location where mass storage is needed.

Figure 2:
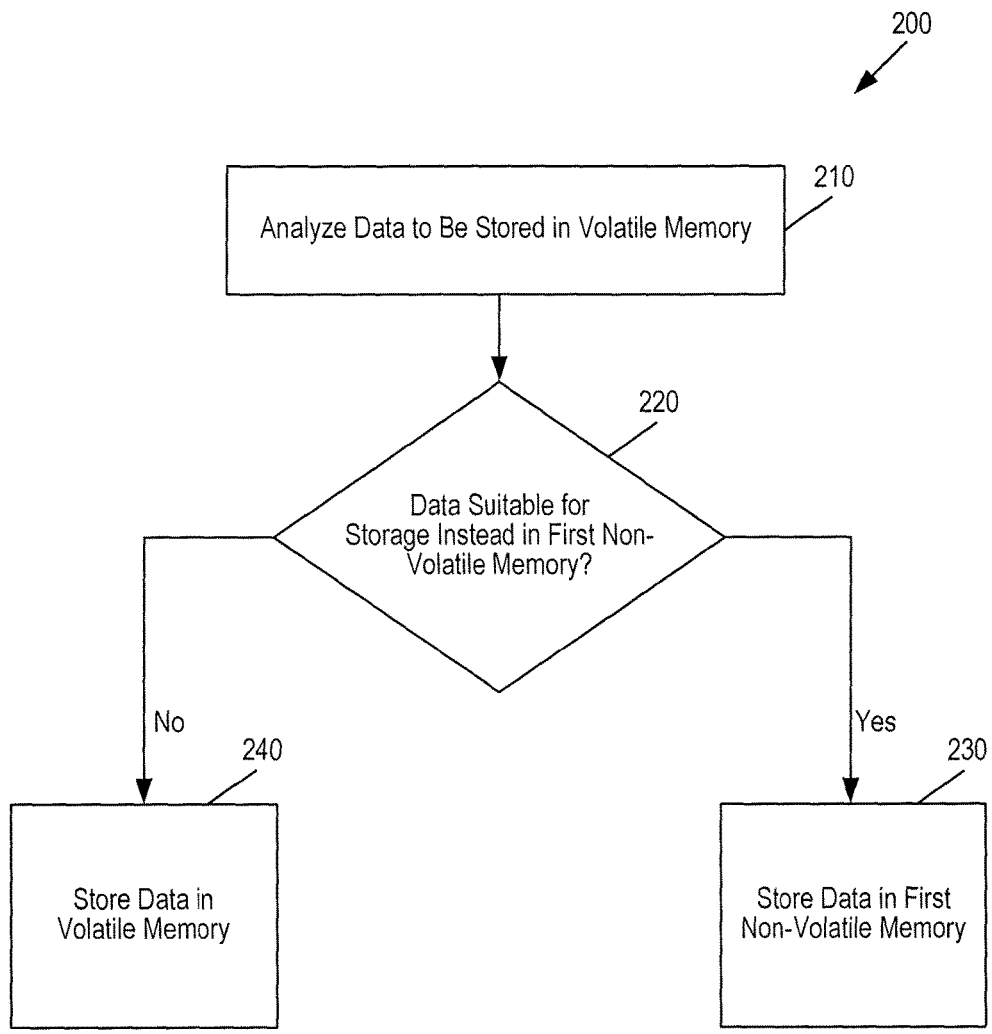
FIG. 2 is a flow chart of a method of an embodiment for using non-volatile memory as a replacement for volatile memory.

As mentioned above, in one embodiment, a method is provided for using non-volatile memory as a replacement for volatile memory. This method will now be discussed in conjunction with the flow chart 200 in FIG. 2. As shown in FIG. 2, when the host 10 has data that it would normally store in RAM 116 of the memory system 100, the host 10 (e.g., the controller 30, the differentiator module 40, or some other component of the host 10) can analyze the data to determine if it should be stored in the volatile memory (RAM) 116 or in the first non-volatile memory 104 (i.e., if data to be stored in the volatile memory 116 is suitable for storage instead in the first non-volatile memory 104) (acts 210 and 220).

If the host 10 determines that the data is suitable for storage instead in the first non-volatile memory 104, the host 10 routes the data to the first non-volatile memory 104 instead of the volatile memory 116 (act 230). (The second non-volatile memory 106 can be used to store data that normally wouldn't be stored in the volatile memory 116, such as user data for long-term storage.) Otherwise, the data is stored in volatile memory 116, as normal (act 240). The host 10 can cause the data to be stored in any suitable way. For example, in one embodiment, the host 10 sends a command or indicator (e.g., flag) along with the data to instruct the memory system 100 which memory to use. In another embodiment, a command or indicator is only sent to the memory system 100 if the data is to be routed to the first non-volatile memory 104 instead of the volatile memory 116.

The data can be analyzed in any suitable way to determine which memory the data should be stored in. For example, the data can be analyzed for its size. Some of the data communicated between the host 10 and the memory system 100 is written in very small chunks and with high frequency. Such data can include, for example, loop counters, global variables, very small data structures, or objects used in different types of codes. Data that is written in small chunks is most likely not suitable for storage in the first non-volatile memory 104, as even the fastest SLC flash typically cannot deal with the high rate of this type of data and can cause the memory system 100 to crash. So, in one embodiment, if the size of the data is below a threshold, the data can be stored in volatile memory 116; otherwise, the data can be stored in the first non-volatile memory 104. In one embodiment, the threshold is predefined and fixed, such that data below the predefined threshold will be considered as ordinary DRAM data, and data above the threshold may be regarded as "friendly" to the first non-volatile memory 104. In another embodiment, the threshold is variable, and a number of recommended default parameters (e.g., set by the host 10, memory system 100, system designer, etc.) can be used to differentiate between ordinary DRAM data and data that is "friendly" to the first non-volatile memory 104. During operation, the threshold values can be changed according to real-life experience.

Figure 3:
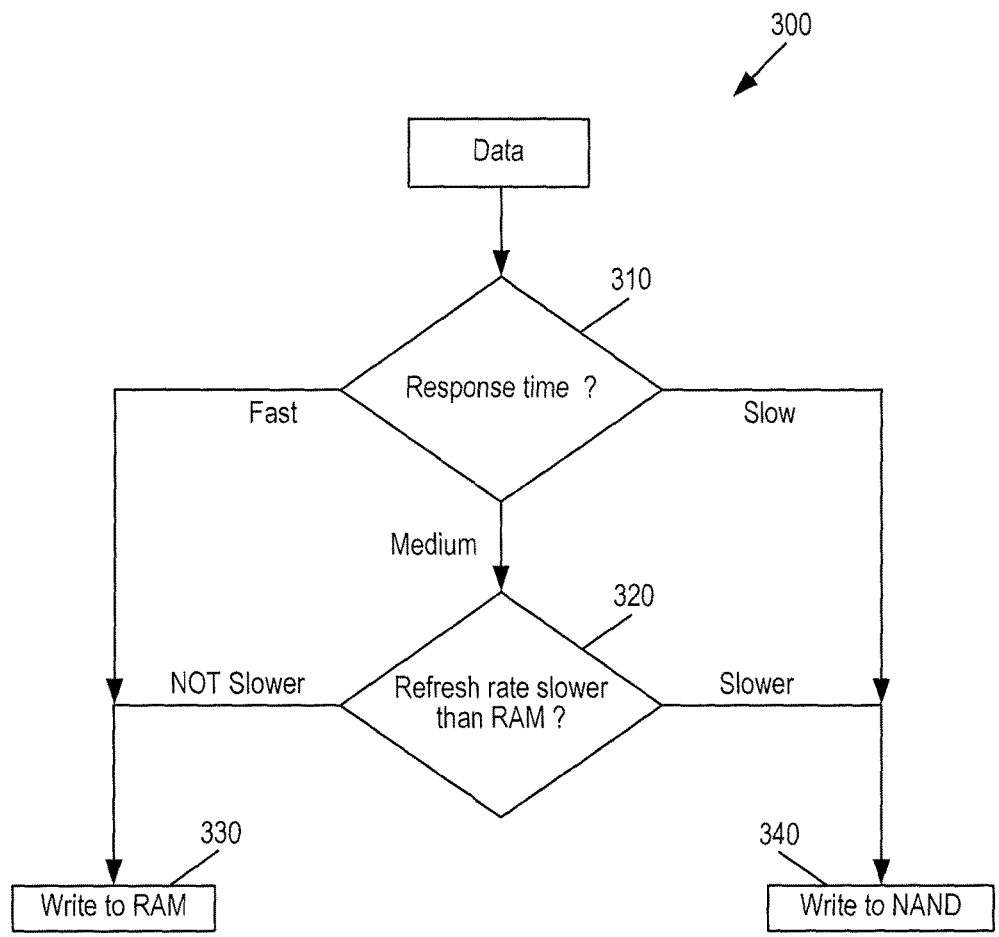
FIG. 3 is a flow chart of a method of an embodiment for analyzing data based on response time and refresh rate.

As another example, the data can be analyzed for its response time and refresh rate. This example is shown in the flow chart 300 in FIG. 3. As shown in FIG. 3, the host 10 determines if the response time for the data is faster than what the first non-volatile memory 104 provides (act 320) and if the refresh rate for the data is faster than a refresh rate of the volatile memory 116 (act 320). If both conditions are met, the data is stored in the volatile memory 116 (act 330). Otherwise, the data is stored in the first non-volatile memory 104 (act 340). In other words, this example differentiates using relative thresholds (e.g., data whose response time is faster than NAND by a predefined first factor but whose refresh rate is lower than the slowest rate which the DRAM may tolerate by a second factor). In one embodiment, a memory management unit (MMU) may be included in the data path (in the host 10 or the memory system 100) and can sign a page as "dirty" (i.e., signing as accessed). Measuring the time that a page was not "dirty" may indicate if the page may be a candidate for migration to the non-volatile memory. Also, the "dirty" flag may be used to identify continuous segments of memory that can be relocated as one continuous block.

Figure 4:
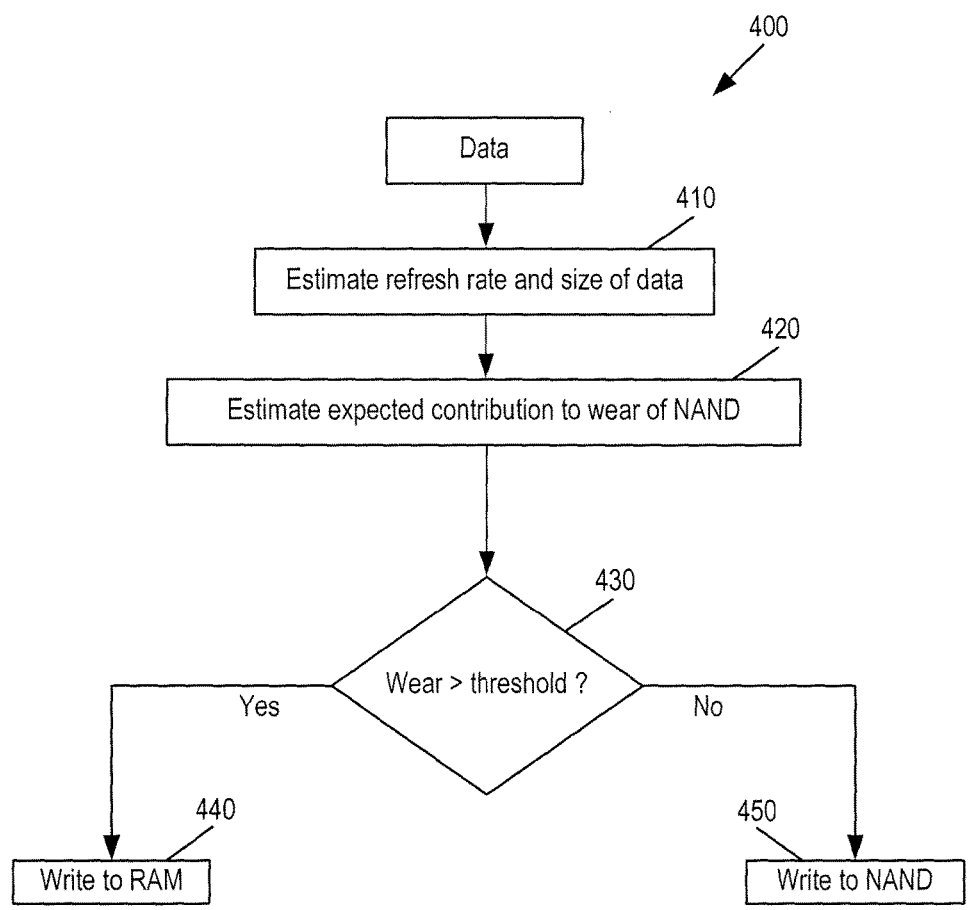
FIG. 4 is a flow chart of a method of an embodiment for analyzing data based on wear rate.

As another example, data can be analyzed for its expected number of write operations relative to an endurance of the first non-volatile memory 104. This example is shown in the flow chart 400 in FIG. 4. As shown in FIG. 4, after the host 10 estimates the refresh rate and data size (act 410), it estimates an expected contribution to the wear of the first non-volatile memory (NAND) (act 420) to see if the wear is greater than a threshold (act 430). If the estimated wear is greater than the threshold, the data is written to volatile memory 116 (act 440). If the estimated wear is not greater than the threshold, the data is written to the first non-volatile memory 104 (act 450). For example, if the first non-volatile memory 104 has a tolerance for a certain amount of rewrites, a data size and an expected number of rewrites relative to the tolerance of the first non-volatile memory 104 and the first non-volatile memory 104 capacity, may be used to derive a criterion for differentiating between "friendly" data that can be stored in the first non-volatile memory 104 and ordinary DRAM data. In particular, if the capacity of the first non-volatile memory 104 is c, and its tolerance to rewrites is t, then a lifetime capacity of c·t may be associated with the first non-volatile memory 104. A data of size s which is expected to be written a times may be associated with a lifetime capacity of a·s. A threshold p can be set such that whenever a·s>p·c·t, (i.e., whenever the lifetime capacity of a data chunk is larger than a given percentage of the lifetime capacity of the first non-volatile memory 104), the data will be assigned to ordinary DRAM 116 and not considered suitable for storage in the first non-volatile memory 104.

As yet another example, the data can be analyzed for its worst-case latency relative to the performance of the first non-volatile memory 104. Data that is associated with a variable whose worst-case latency cannot be satisfied by the first non-volatile memory 104 can be written to ordinary DRAM 116 and not considered as "friendly" to the first non-volatile memory 104. One method for determining the worst-case latency of a variable is by using a profiler to track the variable and acquire statistics on its behavior.

There are many alternatives that can be used with these embodiments. For example, in one embodiment, a standard DRAM interface is used as the interface to the first non-volatile memory 104, and the controller 102 appears as DRAM memory to the host 10. The controller 102 can route data to the DRAM 116 or first non-volatile interface 104, as appropriate. A standard host controller interface (HCI) can be implemented in the controller 102 for communication with the host 10. In another embodiment (shown in FIG. 5), the entities that take responsibility for implementing the differentiation are the compiler 45 and the profiler. The compiler 45 can be provided with the criteria (e.g., from a user 50) for differentiation and implement them in an automatic way, and the profiler may take statistics of the variables to determine their characteristics and whether they can be written to the first non-volatile memory 104 or not.

In some cases, a user or programmer can give indication to the compiler 45 regarding the status of a certain variable. This may be done by adding to the compiler 45 an instruction similar to the likely/unlikely instruction which currently exists in GCC compilers. The likely/unlikely syntax can take the following form:

if (unlikely(x)) {
dosomething( );
}
return x;

This instruction helps the compiler 45 by indicating that x is unlikely to be true; therefore, it should give advantage to the branch where x is not valid.

A similar instruction can be added in the context of this embodiment to indicate that a certain variable is likely to be suitable for "slow DRAM" storage.

Figure 5:
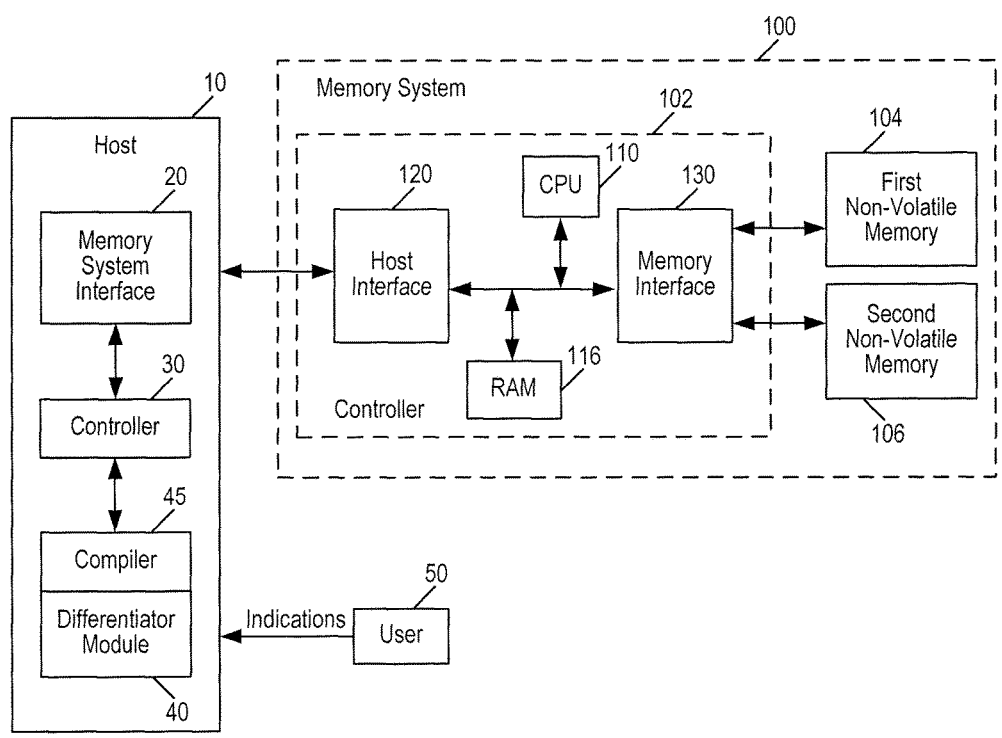
FIG. 5 is a block diagram of a host and memory system of an embodiment.

For example:
_nv_int x=10;
_dram_int y=0;
for(; y<x; y++) {
printf("y=%d\n", y);
} x is a one-time defined parameter. Therefore, it may be written to the first non-volatile memory 104, while y changes on every iteration and therefore y is not a good candidate for the first non-volatile memory 104 and can be assigned to the RAM 116. In the example, the keyword nv to designate that x will be written to the first non-volatile memory 104, and the keyword dram is used to designate that y will be written to volatile RAM 116. However, one of these keywords may be bypassed if there is a default policy, which may be written to either the first non-volatile memory 104 or the RAM 116, for example, and may be decided in runtime by the host's operating system. The "indications" label in FIG. 5 illustrates the situation in which the compiler 45 receives a "likely" command from the user 50 for indicating the status of a variable. Using an optimized profiler and compiler 45 can determine an optimized mix of ordinary DRAM 116 and the first non-volatile memory 104 with a DRAM interface that can perform some of the DRAM tasks. This will result in a lower cost system that does not compromise performance.

In another alternative, the differentiation task is left to the programmer. The programmer can theoretically know best what the requirements are for each data type in the program and should be able to differentiate according to criteria given by the memory system 100 specification. However, in practice, not all programmers have the required skills to differentiate between the data types. Moreover, requiring the programmer to be aware of such issues will complicate the programming significantly.

In yet another alternative, real-time data available at the host's operating system level can be used to determine the routing of data (e.g., to DRAM 16 or to the first non-volatile memory 104 with a DRAM interface). Also, a policy can be defined (via an interface to the host 10) to determine which data will enter the device and which data will not. For example, if a certain chunk of data is detected to be a code which is executed and deleted, but not changed, then the operating system may apply a policy of storing the code in the first non-volatile memory 104 if the read interface of the first non-volatile memory 104 is fast enough for the specific code. When the code is read for execution, it does not need to be stored at all in DRAM cache since it was determined as a read-only data with execute and delete characteristics. So, there is no need to temporary store the data in the DRAM cache. This may be generalized to any data that is determined to be "read only." On the other hand, data that may be subject to change may be initially stored in the first non-volatile memory 104, but when it is read from the first non-volatile memory 104, it can be written to DRAM cache (a "copy on write" method).

The operating system can also gather statistics on various characteristics of the data and determine its storage policy accordingly. Each process running in the system may be considered as an object with a finite number of properties and states. An open process may be in one of three states: (i) it may be running, (ii) it may be waiting (e.g., for a time slot) in order to run, or (iii) it may be in sleep mode. The operating system is aware of every process state and may gather statistics regarding the time it spends in each state. If a certain process is determined to spend significant time in wait and sleep modes, then it may be decided to move its associated data to the first non-volatile memory 104.

These embodiments may also be used in a design phase of a product in order to determine the optimal mix of "fast DRAM" (the first non-volatile memory 104) and "slow DRAM" (the volatile memory 116) in the production version of the product. During the design phase, the product beta version may be equipped with a large amount of "fast DRAM" and "slow DRAM," and the optimal mix of the two may be determined according to the statistics gathered through the process. This process is similar, in general, to other testing and qualifying processes, but the statistics will be specific to the issues discussed in these embodiments.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can he formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for using non-volatile memory as a replacement for volatile memory, the method comprising:
   performing the following in a host in communication with a memory system having volatile memory, a first non-volatile memory, and a second non-volatile memory, wherein the first non-volatile memory has a faster performance and a higher endurance than the second non-volatile memory:
   analyzing data to be stored in the volatile memory to determine if it should be stored in the volatile memory or in the first non-volatile memory;
   in response to determining that the data should be stored in the volatile memory, storing the data in the volatile memory; and
   in response to determining that the data should be stored in the first non-volatile memory, storing the data in the first non-volatile memory instead of in the volatile memory, thereby avoiding reducing available storage space in the volatile memory;
   wherein the data is analyzed for its response time and refresh rate, and wherein if the response time is faster than what the first non-volatile memory provides and if the refresh rate is faster than a refresh rate of the volatile memory, it is determined that the data should be stored in the volatile memory; otherwise, it is determined that the data should be stored in the first non- volatile memory.

2. The method of claim 1, wherein the data is analyzed for its expected number of write operations relative to an endurance of the first non-volatile memory.

3. The method of claim 1, wherein the data is analyzed for its worst-case latency relative to the performance of the first non-volatile memory.

4. The method of claim 1 further comprising using operating system data to gather characteristics of data stored in the volatile memory and the first non-volatile memory and applying that data as a storage policy.

5. The method of claim 1, wherein at least one of the volatile memory, the first non-volatile memory, and the second non-volatile memory is a three-dimensional memory.

6. The method of claim 1, wherein the memory system is embedded in the host.

7. The method of claim 1, wherein the memory system is removably connected to the host.

8. A host comprising:
- an interface configured to communicate with a memory system having volatile memory, a first non-volatile memory, and a second non-volatile memory, wherein the first non-volatile memory has a faster performance and a higher endurance than the second non-volatile memory; and
- a controller in communication with the interface, wherein the controller is configured to:
  - determine if data to be stored in the volatile memory is suitable for storage instead in the first non-volatile memory; and
  - in response to determining that the data is suitable for storage instead in the first non-volatile memory, routing the data to the first non-volatile memory instead of the volatile memory, thereby avoiding reducing available storage space in the volatile memory;
- wherein the controller k configured to analyze the data for its response time and refresh rate, and wherein if the response time is faster than what the first non-volatile memory provides and if the refresh rate is faster than a refresh rate of the volatile memory, it is determined that the data should he stored in the volatile memory; otherwise, it is determined that the data should be stored in the first non-volatile memory.

9. The host of claim 8, wherein the controller is configured to analyze the data for its expected number of write operations relative to an endurance of the first non-volatile memory.

10. The host of claim 8, wherein the controller is configured to analyze the data for its worst-case latency relative to the performance of the first non-volatile memory.

11. The host of claim 8, wherein the controller is further configured to use operating system data to gather characteristics of data stored in the volatile memory and the first non-volatile memory and applying that data as a storage policy.

12. The host of claim 8, wherein at least one of the volatile memory, the first non-volatile memory, and the second non-volatile memory is a three-dimensional memory.

13. The host of claim 8, wherein the memory system is embedded in the host.

14. The host of claim 8, wherein the memory system is removably connected to the host.

15. A host comprising:
- an interface configured to communicate with a memory system having volatile memory, a first non-volatile memory, and a second non-volatile memory, wherein the first non-volatile memory has a faster performance and a higher endurance than the second non-volatile memory;
- means for analyzing data to be stored in the volatile memory to determine if it should be stored in the volatile memory or in the first non-volatile memory;
- means for in response to determining that the data should be stored in the volatile memory, storing the data in the volatile memory; and
- means for in response to determining that the data should be stored in the first non-volatile memory, storing the data in the first non-volatile memory instead of in the volatile memory, thereby avoiding reducing available storage space in the volatile memory;
- wherein the data is analyzed for its response time and refresh rate, and wherein if the response time is faster than what the first non-volatile memory provides and if the refresh rate is faster than a refresh rate of the volatile memory, it is determined that the data should be stored in the volatile memory; otherwise, it is determined that the data should be stored hi the first non- volatile memory.

16. The host of claim 15, wherein the data is analyzed for its expected number of write operations relative to an endurance of the first non-volatile memory.

17. The host of claim 15, wherein the data is analyzed for its worst-case latency relative to the performance of the first non-volatile memory.

18. The host of claim 15 further comprising means for using operating system data to gather characteristics of data stored in the volatile memory and the first non-volatile memory and applying that data as a storage policy.

19. The host of claim 15, wherein at least one of the volatile memory, the first non-volatile memory, and the second non-volatile memory is a three-dimensional memory.

20. The host of claim 15, wherein the memory system is embedded in the host.

* * * * *